(12) United States Patent  
Yoshida

(10) Patent No.: US 8,693,594 B2  
(45) Date of Patent: Apr. 8, 2014

(54) SEMICONDUCTOR INTEGRATED CIRCUIT AND RECEIVER

(75) Inventor: Hiroshi Yoshida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 184 days.

(21) Appl. No.: 13/423,409

(22) Filed: Mar. 19, 2012

(65) Prior Publication Data

US 2013/0142293 A1 Jun. 6, 2013

(30) Foreign Application Priority Data

Dec. 6, 2011 (JP) ................. 2011-266449

(51) Int. Cl.
*H04L 27/08* (2006.01)

(52) U.S. Cl.
USPC .......................................................... 375/345

(58) Field of Classification Search
USPC .......................................................... 375/345
See application file for complete search history.

(56) References Cited

U.S. PATENT DOCUMENTS

| | | | |
|---|---|---|---|
| 6,498,929 B1* | 12/2002 | Tsurumi et al. | 455/296 |
| 2002/0042256 A1* | 4/2002 | Baldwin et al. | 455/232.1 |
| 2004/0203460 A1* | 10/2004 | Hasegawa | 455/67.13 |
| 2009/0258640 A1* | 10/2009 | Persson et al. | 455/425 |
| 2011/0206144 A1* | 8/2011 | Yamamoto et al. | 375/259 |

FOREIGN PATENT DOCUMENTS

| | | |
|---|---|---|
| JP | 11-289231 | 10/1999 |
| JP | 2003-273947 | 9/2003 |

\* cited by examiner

*Primary Examiner* — Don N Vo  
(74) *Attorney, Agent, or Firm* — Oblon, Spivak, McClelland, Maier & Neustadt, L.L.P.

(57) ABSTRACT

The receiver includes a first arithmetic circuit that calculates a first mean value of the third signal in a preset first measurement setting period. The receiver includes a second arithmetic circuit that calculates a second mean value of the fourth signal in the first measurement setting period. The receiver includes a control circuit that controls the first arithmetic circuit and the second arithmetic circuit, changes the first set value according to the first mean value, and changes the second set value according to the second mean value.

20 Claims, 4 Drawing Sheets

US 8,693,594 B2

SEMICONDUCTOR INTEGRATED CIRCUIT AND RECEIVER

CROSS-REFERENCE TO RELATED APPLICATION

This application is based upon and claims the benefit of priority from the prior Japanese Patent Application No. 2011-266449, filed on Dec. 6, 2011, the entire contents of which are incorporated herein by reference.

BACKGROUND

1. Field

Embodiments described herein relate generally to a semiconductor integrated circuit and a receiver.

2. Background Art

Conventionally, some automatic gain control (AGC) circuits used for receivers control the gains of variable gain amplifiers so as to set the root mean square of the I channel and the Q channel of a quadrature baseband signal at a target value. This control operation sets an input to an analog/digital converter at a proper level.

In a control operation of such an AGC circuit, variations in the gains of variable gain amplifiers for I and Q channels need to be separately corrected. In the case where the variations are inaccurately corrected due to, for example, temperature characteristics, AGC cannot be properly performed.

BRIEF DESCRIPTION OF THE DRAWINGS

In FIG. 6, the same reference numerals as in FIG. 1 indicate the same configurations as in the first embodiment.

DETAILED DESCRIPTION

A receiver according to an embodiment includes an antenna that receives an RF signal. The receiver according to an embodiment includes a low noise amplifier that amplifies the received RF signal and outputs the signal. The receiver according to an embodiment includes a local oscillating circuit that outputs a local oscillation signal. The receiver according to an embodiment includes a $\pi/2$ phase shifter that outputs a signal obtained by phase-shifting the local oscillation signal by $\pi/2$. The receiver according to an embodiment includes a first mixer circuit that outputs a mixed signal of the signal outputted from the low noise amplifier and the local oscillation signal. The receiver according to an embodiment includes a second mixer circuit that outputs a mixed signal of the signal outputted from the low noise amplifier and the signal outputted from the $\pi/2$ phase shifter. The receiver according to an embodiment includes a first low-pass filter that filters the signal from the first mixer circuit to output a first signal. The receiver according to an embodiment includes a second low-pass filter that filters the signal from the second mixer circuit to output a second signal. The receiver according to an embodiment includes a first variable gain amplifier that amplifies the first signal to output a third signal, the first variable gain amplifier having a gain variable with a first set value. The receiver according to an embodiment includes a second variable gain amplifier that amplifies the second signal to output a fourth signal, the second variable gain amplifier having a gain variable with a second set value. The receiver according to an embodiment includes a first arithmetic circuit that calculates a first mean value of the third signal in a preset first measurement setting period. The receiver according to an embodiment includes a second arithmetic circuit that calculates a second mean value of the fourth signal in the first measurement setting period. The receiver according to an embodiment includes a control circuit that controls the first arithmetic circuit and the second arithmetic circuit, changes the first set value according to the first mean value, and changes the second set value according to the second mean value. The receiver according to an embodiment includes a demodulator that outputs a signal demodulated from the third signal and the fourth signal.

Hereafter, a semiconductor integrated circuit and a receiver according to the present invention will be described more specifically with reference to the drawings.

Embodiments will be described below with reference to the accompanying drawings.

First Embodiment

Figure 1:
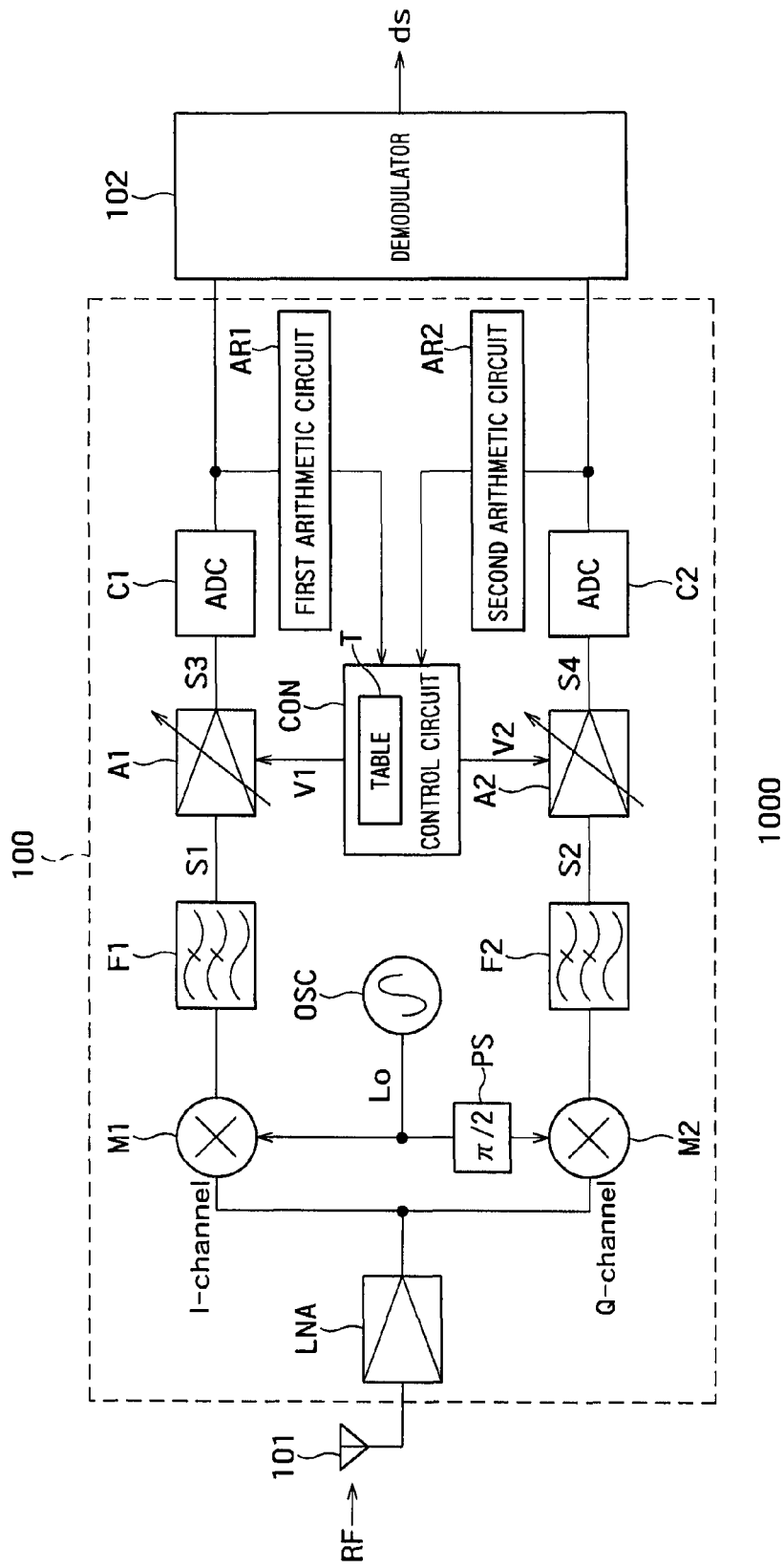
FIG. 1 is a diagram showing an example of the configuration of a receiver 1000 according to a first embodiment.

FIG. 1 illustrates an example of the configuration of a receiver 1000 according to a first embodiment.

As illustrated in FIG. 1, the receiver 1000 includes a semiconductor integrated circuit 100, an antenna 101, and a demodulator 102.

The antenna 101 receives a radio frequency (RF) signal.

The semiconductor integrated circuit 100 outputs a signal obtained by processing the received RF signal.

The demodulator 102 demodulates the signal from the semiconductor integrated circuit 100 to output a demodulated signal ds.

As illustrated in FIG. 1, the semiconductor integrated circuit 100 includes a low noise amplifier LNA, a local oscillating circuit OSC, a $\pi/2$ phase shifter PS, a first mixer circuit M1, a second mixer circuit M2, a first low-pass filter F1, a second low-pass filter F2, a first variable gain amplifier A1, a second variable gain amplifier A2, a first arithmetic circuit AR1, a second arithmetic circuit AR2, a first analog/digital converter C1, a second analog/digital converter C2, and a control circuit CON.

The low noise amplifier LNA amplifies the RF signal received by the antenna 101 and then outputs the RF signal.

The local oscillating circuit OSC outputs a local oscillation signal Lo.

The $\pi/2$ phase shifter PS outputs a signal obtained by phase-shifting the local oscillation signal Lo by $\pi/2$.

The first mixer circuit M1 outputs a mixed signal (I channel component) of the signal outputted from the low noise amplifier LNA and the local oscillation signal Lo.

The second mixer circuit M2 outputs a mixed signal (Q channel component) of the signal outputted from the low noise amplifier LNA and the signal outputted from the $\pi/2$ phase shifter PS.

The first low-pass filter F1 filters the signal (I channel component) from the first mixer circuit M1 to output a first signal S1.

The second low-pass filter F2 filters the signal (Q channel component) from the second mixer circuit M2 to output a second signal S2.

The first variable gain amplifier A1 amplifies first signal S1 to output a third signal S3. The gain of the first variable gain amplifier A1 varies with a first set value V1.

The second variable gain amplifier A2 amplifies the second signal S2 to output a fourth signal S4. The gain of the second variable gain amplifier A2 varies with a second set value V2.

For the first and second variable gain amplifiers A1 and A2, for example, a circuit design configuration at a transistor level has an open-loop configuration. In other words, an RF bandwidth has to be considerably larger than in a conventional configuration according to an increase in transmission rate. In order to obtain a desired gain over such a wide band, a GmC amplifier involving no feedback is used instead of an active RC configuration generally used in a conventional circuit design and a GmC amplifier involving feedback.

The first analog/digital converter C1 converts the third signal S3 to a digital signal and outputs the signal to the first arithmetic circuit AR1.

The second analog/digital converter C2 converts the fourth signal S4 to a digital signal and outputs the signal to the second arithmetic circuit AR2.

The first arithmetic circuit AR1 calculates a first mean value of the third signal S3 in a preset first measurement setting period D1. In this case, the first arithmetic circuit AR1 calculates the first mean value of the digitized third signal S3 and then outputs the first set value V1 corresponding to the calculation result.

The second arithmetic circuit AR2 calculates a second mean value of the fourth signals S4 in the first measurement setting period D1. In this case, the second arithmetic circuit AR2 calculates the second mean value of the digitized fourth signal S4 and then outputs the second set value V2 corresponding to the calculation result.

The control circuit CON controls the first arithmetic circuit AR1 and the second arithmetic circuit AR2. Moreover, the control circuit CON changes the first set value V1 according to the first mean value calculated by the first arithmetic circuit AR1 and changes the second set value V2 according to the second mean value calculated by the second arithmetic circuit AR2. As described above, the gains of the first and second variable gain amplifiers A1 and A2 vary with the changed first and second set values V1 and V2.

For example, the control circuit CON gradually changes the first set value V1 such that the first mean value approaches a target value, and gradually changes the second set value V2 such that the second mean value approaches the target value.

Thus, the gains of the first and second variable gain amplifiers A1 and A2 approach the same predetermined gain according to the changed first and second set values V1 and V2, which suppresses the influence of variations in the gains of the first and second variable gain amplifiers A1 and A2.

Figure 2:
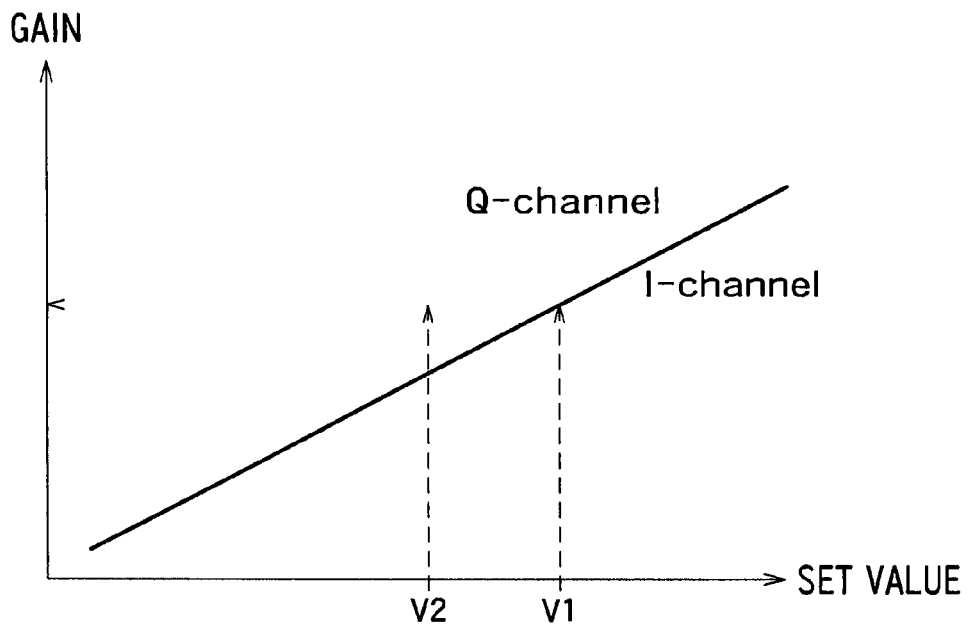
FIG. 2 is a diagram showing an example of the relationship between the first and second set values V1 and V2 changed by the control circuit and gains of the first and second variable gain amplifiers A1 and A2.

FIG. 2 shows an example of the relationship between the first and second set values V1 and V2 changed by the control circuit and gains of the first and second variable gain amplifiers A1 and A2.

As shown in FIG. 2, the first and second variable gain amplifiers A1 and A2 have gains of varying characteristics. However, as described above, the control circuit CON changes the set values respectively for the first and second variable gain amplifiers A1 and A2, thereby reducing variations in the gains of the first and second variable gain amplifiers A1 and A2.

As illustrated in FIG. 1, the control circuit CON includes a table T that defines, for example, the relationship between the gain of the first variable gain amplifier A1 and the first set value V1 and the relationship between the gain of the second variable gain amplifier A2 and the second set value V2.

The control circuit CON selects, based on the table T, the first set value V1 corresponding to the gain of the first variable gain amplifier A1 such that the first mean value reaches the target value, and then the control circuit CON outputs the selected first set value V1.

Moreover, the control circuit CON selects, based on the table T, the second set value V2 corresponding to the gain of the second variable gain amplifier A2 such that the second mean value reaches the target value, and then the control circuit CON outputs the selected second set value V2.

Thus, AGC can be completed with higher speed.

The control circuit CON updates the table T so as to reflect the relationship between the selected first set value V1 and the first mean value obtained when the gain of the first variable gain amplifier A1 is set according to the selected first set value V1. In other words, the control circuit CON updates the relationship between the gain of the first variable gain amplifier A1 and the first set value V1 in the table T such that the selected first set value V1 corresponds to the current gain of the first variable gain amplifier A1.

Likewise, the control circuit CON updates the table T so as to reflect the relationship between the selected second set value V2 and the second mean value obtained when the gain of the second variable gain amplifier A2 is set according to the selected second set value V2. In other words, the control circuit CON updates the relationship between the gain of the second variable gain amplifier A2 and the second set value V2 in the table T such that the selected second set value V2 corresponds to the current gain of the second variable gain amplifier A2.

The table T is sequentially updated in this way based on a corrected IQ amplitude error.

In the case of AGC according to the present embodiment with different DC offsets superimposed respectively for an I channel and a Q channel, a gain different from a desired gain is set, which may lead to degradation of EVM characteristics.

Thus, the control circuit CON changes the first set value V1 after the DC offset of the first variable gain amplifier A1 is cancelled. Furthermore, the control circuit CON changes the second set value V2 after the DC offset of the second variable gain amplifier A2 is cancelled.

It is therefore possible to suppress the influence of a DC offset on the gain control of the first and second variable gain amplifiers A1 and A2.

As described above, the demodulator 102 demodulates the digitized third signal S3 and the digitized fourth signal S4 to output the demodulated signal ds.

In the example of FIG. 1, the variable gain amplifiers for analog gain control perform AGC separately for IQ. A variable gain amplifier for digital gain control may be provided in the subsequent stage of the ADCs to digitally control gains.

Specifically, the first analog/digital converter C1 may convert the first signal S1 to a digital signal and output the signal to the first variable gain amplifier A1, and the second analog/digital converter C2 may convert the second signal S2 to a digital signal and output the signal to the second variable gain amplifier A2. In this case, the first variable gain amplifier A1 amplifies the digitized first signal S1 to output the third signal S3, and the second variable gain amplifier A2 amplifies the digitized second signal S2 to output the fourth signal S4.

Figure 3:
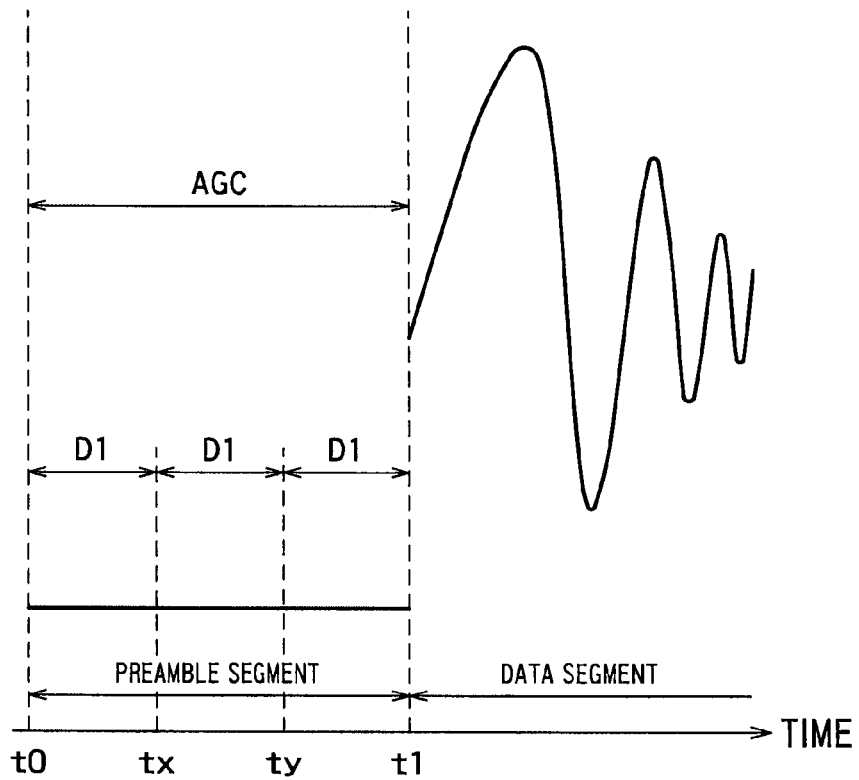
FIG. 3 is a diagram showing the relationship between a packet configuration of the RF signal and a period of AGC.

FIG. 3 shows the relationship between a packet configuration of the RF signal and a period of AGC.

As shown in FIG. 3, in a preamble segment having a constant amplitude in an RF signal packet, the first measurement setting period D1 (times t0 to tx, tx to ty, ty to t1) is set and the first and second set values V1 and V2 are changed.

It is therefore possible to more properly suppress the influence of variations in the gains of the I channel component and the Q channel component.

As for power in a data segment, a signal has an IQ deviation. Thus, in a data segment specifying data in a packet of the RF signal, the first measurement setting period D1 is not set and the first and second set values V1 and V2 are not changed.

Figure 4:
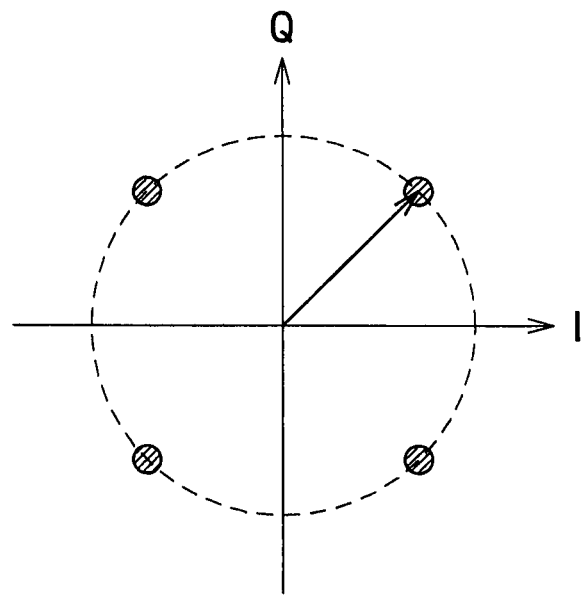
FIG. 4 is a diagram showing EVM in the absence of an IQ amplitude error.
Figure 5:
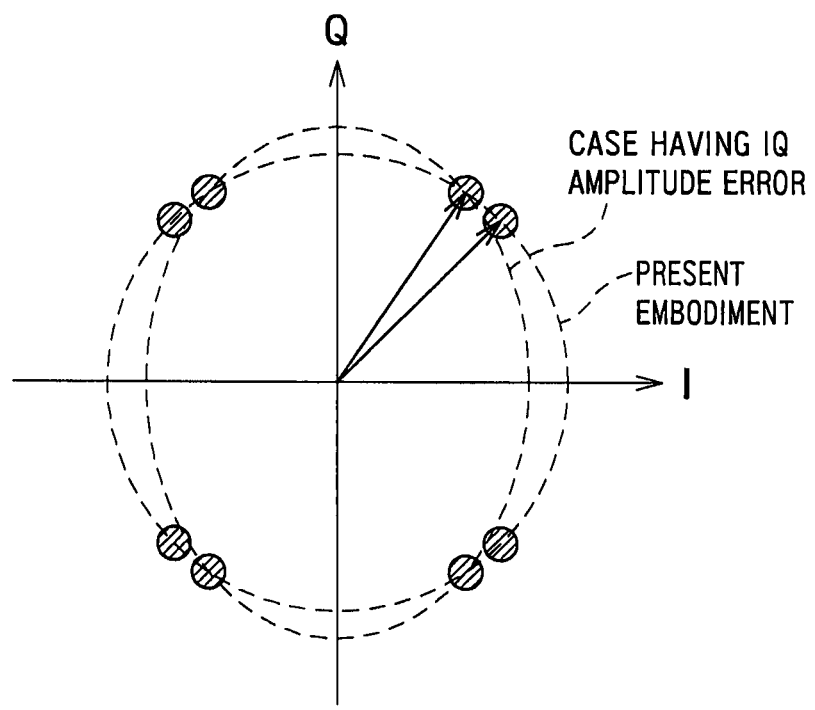
FIG. 5 is a diagram showing EVM in the presence of an IQ amplitude error according to the present embodiment.

FIG. 4 shows EVM in the absence of an IQ amplitude error. FIG. 5 shows EVM in the presence of an IQ amplitude error according to the present embodiment. FIG. 5 shows an example in which a Q channel has a high gain in the presence of an IQ amplitude error.

In the absence of an IQ amplitude error, as shown in FIG. 4, error vector magnitude (EVM) forms a circle having a radius of 1.

In the presence of an IQ amplitude error, as shown in FIG. 5, EVM forms an oval with an extended Q channel component. According to the present embodiment, however, AGC can be performed separately on an I channel component, forming a larger circle than that of FIG. 4. In other words, variations in the gains of the Q channel component and the I channel component can be equivalently reduced.

In the case where the modulation scheme is QPSK, the control circuit CON changes the first set value V1 and the second set value V2. For example, in the case of multiple modulation systems, the control circuit CON does not change the set values in quadrature amplitude modulation (QAM) but changes the set values in quadrature phase shift keying (QPSK).

Hence, malfunctions can be prevented in AGC performed on a modulating signal varying in distance from a point of origin to a signal point.

As described above, a power is calculated for each of the I channel and the Q channel and AGC is performed to keep the power constant, thereby automatically correcting an IQ amplitude error.

In a wide-band system (for example, TransferJet operates at 280 MHz, which is thirty times higher than in a conventional system), it is difficult to secure the accuracy of gain of a variable gain amplifier in circuit design. Particularly, an IQ gain difference varying with a set gain is quite difficult to correct.

According to the present embodiment, in modulation schemes such as π/2 shift binary phase-shift keying (BPSK) and Gaussian filtered minimum shift keying (GMSK), accuracy is easily secured for a modulating signal having a constant distance from a point of origin to a signal point. Such simple modulation schemes are generally applied to a wide-band system.

The wide-band system is frequently used for, for example, short-distance radio communications in which fading or the like causes only a few time variations of a transmission path because of a short transmission/reception distance. Thus, the present embodiment is more effectively Implemented.

As described above, the receiver according to the present embodiment can reduce variations in the gains of the variable gain amplifiers for the I channel and the Q channel.

Second Embodiment

A second embodiment will describe a structural example in which a third arithmetic circuit for calculating a root mean square is further provided.

Figure 6:
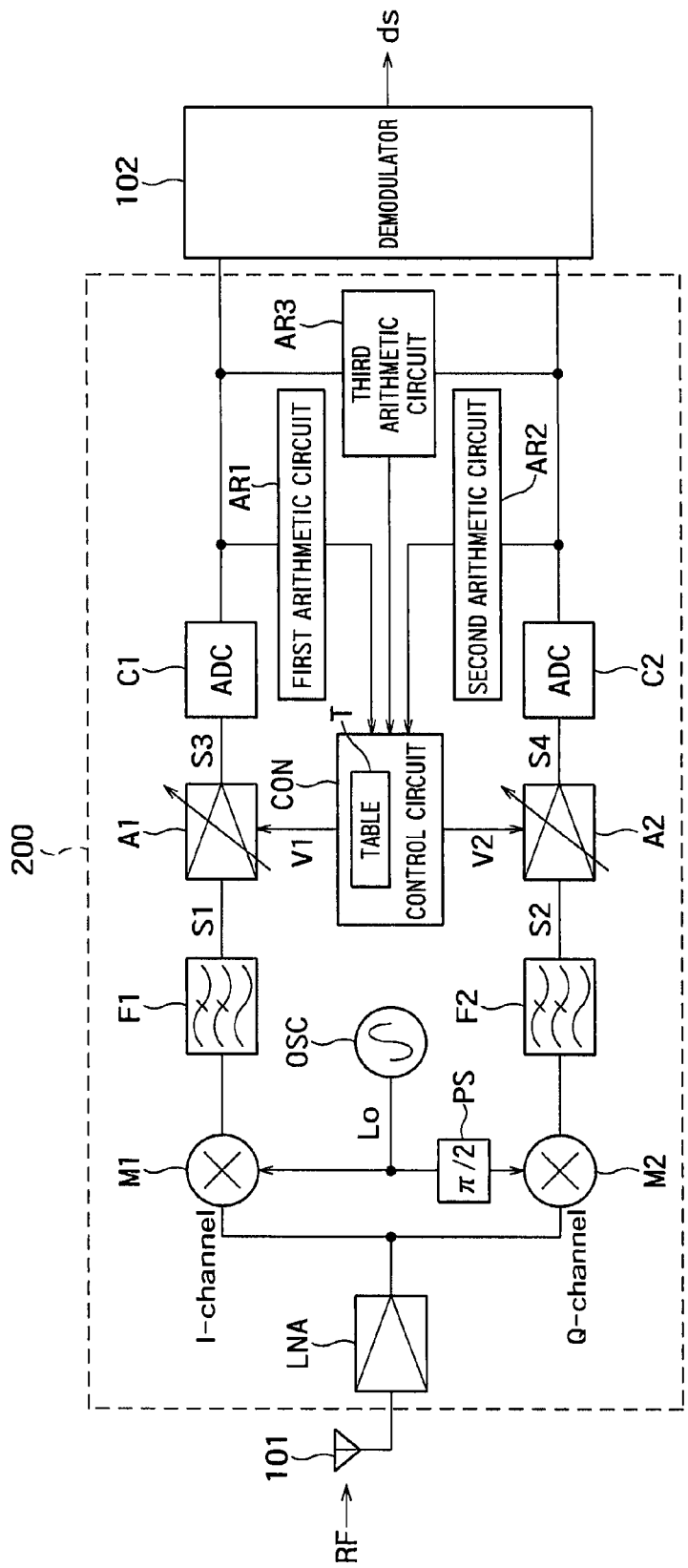
FIG. 6 is a diagram showing an example of the configuration of a receiver 2000 according to the second embodiment.

FIG. 6 illustrates an example of the configuration of a receiver 2000 according to the second embodiment. In FIG. 6, the same reference numerals as in FIG. 1 indicate the same configurations as in the first embodiment.

As illustrated in FIG. 6, the receiver 2000 includes a semiconductor integrated circuit 200, an antenna 101, and a demodulator 102.

The semiconductor integrated circuit 200 further includes a third arithmetic circuit AR3 unlike in the semiconductor integrated circuit 100 of the first embodiment.

The third arithmetic circuit AR3 calculates the root mean square of a third signal S3 and a fourth signal S4 in a preset second measurement setting period D2.

In this configuration, a control circuit CON controls the third arithmetic circuit AR3 and changes a first set value V1 and a second set value V2 according to the root mean square.

The control circuit CON changes the first set value V1 and the second set value V2 such that the root mean square approaches a target value.

For example, the second measurement setting period D2 is set prior to a first measurement setting period D1. Specifically, in this case, the control circuit CON changes the first set value V1 and the second set value V2 according to the root mean square calculated by the third arithmetic circuit AR3, and then the control circuit CON changes the first set value V1 according to a first mean value calculated by a first arithmetic circuit AR1 and changes the second set value V2 according to a second mean value calculated by a second arithmetic circuit AR2.

In other words, AGC is performed to keep constant the powers of I and Q channel components, and then only a small error is corrected for each of the I and Q channel components.

Thus, variations in the gains of variable gain amplifiers for I and Q channels can be more effectively reduced.

The second measurement setting period D2 may be set behind the first measurement setting period D1. In this case, the control circuit CON changes the first set value V1 according to the first mean value calculated by the first arithmetic circuit AR1 and changes the second set value V2 according to the second mean value calculated by the second arithmetic circuit AR2, and then the control circuit CON changes the first set value V1 and the second set value V2 according to the root mean square calculated by the third arithmetic circuit AR3.

In other words, AGC is performed separately on the I and Q channel components and finally the total power of the I and Q components is slightly adjusted. AGC may be performed again if the error of the I and Q channel components exceeds a predetermined value.

Other configurations and functions of the receiver 2000 are similar to those of the receiver 1000 according to the first embodiment.

Thus, as in the first embodiment, the receiver according to the present embodiment can reduce variations in the gains of the variable gain amplifiers for the I channel and the Q channel.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A receiver comprising:
   an antenna that receives an RF signal;
   a low noise amplifier that amplifies the received RF signal and outputs the signal;
   a local oscillating circuit that outputs a local oscillation signal;
   a $\pi/2$ phase shifter that outputs a signal obtained by phase-shifting the local oscillation signal by $\pi/2$;
   a first mixer circuit that outputs a mixed signal of the signal outputted from the low noise amplifier and the local oscillation signal;
   a second mixer circuit that outputs a mixed signal of the signal outputted from the low noise amplifier and the signal outputted from the $\pi/2$ phase shifter;
   a first low-pass filter that filters the signal from the first mixer circuit to output a first signal;
   a second low-pass filter that filters the signal from the second mixer circuit to output a second signal;
   a first variable gain amplifier that amplifies the first signal to output a third signal, the first variable gain amplifier having a gain variable with a first set value;
   a second variable gain amplifier that amplifies the second signal to output a fourth signal, the second variable gain amplifier having a gain variable with a second set value;
   a first arithmetic circuit that calculates a first mean value of the third signal in a preset first measurement setting period;
   a second arithmetic circuit that calculates a second mean value of the fourth signal in the first measurement setting period;
   a control circuit that controls the first arithmetic circuit and the second arithmetic circuit, changes the first set value according to the first mean value, and changes the second set value according to the second mean value; and
   a demodulator that outputs a signal demodulated from the third signal and the fourth signal.

2. The receiver according to claim 1, wherein the control circuit changes the first set value such that the first mean value approaches a target value, and the control circuit changes the second set value such that the second mean value approaches the target value.

3. The receiver according to claim 1, wherein the control circuit changes the first set value after a DC offset of the first variable gain amplifier is cancelled, and
   the control circuit changes the second set value after a DC offset of the second variable gain amplifier is cancelled.

4. The receiver according to claim 1, wherein the control circuit includes a table that defines a relationship between the gain of the first variable gain amplifier and the first set value and a relationship between the gain of the second variable gain amplifier and the second set value,
   the control circuit selects, based on the table, the first set value corresponding to the gain of the first variable gain amplifier such that the first mean value reaches a target value, and outputs the selected first set value, and
   the control circuit selects, based on the table, the second set value corresponding to the gain of the second variable gain amplifier such that the second mean value reaches the target value, and outputs the selected second set value.

5. The receiver according to claim 4, wherein the control circuit updates the table so as to reflect a relationship between the selected first set value and the first mean value when the gain of the first variable gain amplifier is set according to the selected first set value or a relationship between the selected second set value and the second mean value when the gain of the second variable gain amplifier is set according to the selected second set value.

6. The receiver according to claim 1, further comprising a third arithmetic circuit that calculates a root mean square of the third signal and the fourth signal in a preset second measurement setting period,
   wherein the control circuit controls the third arithmetic circuit and changes the first set value and the second set value according to the root mean square.

7. The receiver according to claim 6, wherein the second measurement setting period precedes the first measurement setting period, and
   after changing the first set value and the second set value according to the root mean square, the control circuit changes the first set value according to the first mean value and changes the second set value according to the second mean value.

8. The receiver according to claim 6, wherein the second measurement setting period is set behind the first measurement setting period, and
   after changing the first set value according to the first mean value and the second set value according to the second mean value, the control circuit changes the first set value and changes the second set value according to the root mean square.

9. The receiver according to claim 1, wherein the first measurement setting period is set in a preamble segment to change the first and second set values, the preamble segment having a constant amplitude in a packet of the RF signal.

10. The receiver according to claim 9, wherein in a data segment specifying data in a packet of the RF signal, the first measurement setting period is not set and the first and second set values are not changed.

11. A semiconductor integrated circuit comprising:
    a low noise amplifier that amplifies a received RF signal and outputs the signal;
    a local oscillating circuit that outputs a local oscillation signal;
    a $\pi/2$ phase shifter that outputs a signal obtained by phase-shifting the local oscillation signal by $\pi/2$;
    a first mixer circuit that outputs a mixed signal of the signal outputted from the low noise amplifier and the local oscillation signal;
    a second mixer circuit that outputs a mixed signal of the signal outputted from the low noise amplifier and the signal outputted from the $\pi/2$ phase shifter;
    a first low-pass filter that filters the signal from the first mixer circuit to output a first signal;
    a second low-pass filter that filters the signal from the second mixer circuit to output a second signal;
    a first variable gain amplifier that amplifies the first signal to output a third signal, the first variable gain amplifier having a gain variable with a first set value;
    a second variable gain amplifier that amplifies the second signal to output a fourth signal, the second variable gain amplifier having a gain variable with a second set value;
    a first arithmetic circuit that calculates a first mean value of the third signal in a preset first measurement setting period;
    a second arithmetic circuit that calculates a second mean value of the fourth signal in the first measurement setting period; and
    a control circuit that controls the first arithmetic circuit and the second arithmetic circuit, changes the first set value according to the first mean value, and changes the second set value according to the second mean value.

12. The semiconductor integrated circuit according to claim 11, wherein the control circuit changes the first set value such that the first mean value approaches a target value, and the control circuit changes the second set value such that the second mean value approaches the target value.

13. The semiconductor integrated circuit according to claim 11, wherein the control circuit changes the first set value after a DC offset of the first variable gain amplifier is cancelled, and
the control circuit changes the second set value after a DC offset of the second variable gain amplifier is cancelled.

14. The semiconductor integrated circuit according to claim 11, wherein the control circuit includes a table that defines a relationship between the gain of the first variable gain amplifier and the first set value and a relationship between the gain of the second variable gain amplifier and the second set value,
the control circuit selects, based on the table, the first set value corresponding to the gain of the first variable gain amplifier such that the first mean value reaches a target value, and outputs the selected first set value, and
the control circuit selects, based on the table, the second set value corresponding to the gain of the second variable gain amplifier such that the second mean value reaches the target value, and outputs the selected second set value.

15. The semiconductor integrated circuit according to claim 14, wherein the control circuit updates the table so as to reflect a relationship between the selected first set value and the first mean value when the gain of the first variable gain amplifier is set according to the selected first set value or a relationship between the selected second set value and the second mean value when the gain of the second variable gain amplifier is set according to the selected second set value.

16. The semiconductor integrated circuit according to claim 11, further comprising a third arithmetic circuit that calculates a root mean square of the third signal and the fourth signal in a preset second measurement setting period,
wherein the control circuit controls the third arithmetic circuit and changes the first set value and the second set value according to the root mean square.

17. The semiconductor integrated circuit according to claim 16, wherein the second measurement setting period precedes the first measurement setting period, and
after changing the first set value and the second set value according to the root mean square, the control circuit changes the first set value according to the first mean value and changes the second set value according to the second mean value.

18. The semiconductor integrated circuit according to claim 16, wherein the second measurement setting period is set behind the first measurement setting period, and
after changing the first set value according to the first mean value and the second set value according to the second mean value, the control circuit changes the first set value and changes the second set value according to the root mean square.

19. The semiconductor integrated circuit according to claim 11, wherein the first measurement setting period is set in a preamble segment to change the first and second set values, the preamble segment having a constant amplitude in a packet of the RF signal.

20. The semiconductor integrated circuit according to claim 19, wherein, in a data segment specifying data in a packet of the RF signal, the first measurement setting period is not set and the first and second set values are not changed.

* * * * *